(12) United States Patent
Haematsu

(10) Patent No.: US 9,583,412 B2
(45) Date of Patent: Feb. 28, 2017

(54) SEMICONDUCTOR DEVICE

(71) Applicant: Sumitomo Electric Device Innovations, Inc., Yokohama-shi (JP)

(72) Inventor: Hitoshi Haematsu, Yokohama (JP)

(73) Assignee: Sumitomo Electric Device Innovations, Inc., Yokohama-shi (JP)

( * ) Notice: Subject to any disclaimer, the term of this patent is extended or adjusted under 35 U.S.C. 154(b) by 20 days.

(21) Appl. No.: 14/274,507

(22) Filed: May 9, 2014

(65) Prior Publication Data
US 2014/0332865 A1 Nov. 13, 2014

(30) Foreign Application Priority Data

May 10, 2013 (JP) .................................. 2013-100364

(51) Int. Cl.
*H01L 23/29* (2006.01)
*H01L 23/31* (2006.01)
*H01L 23/00* (2006.01)

(52) U.S. Cl.
CPC .......... *H01L 23/3192* (2013.01); *H01L 24/05* (2013.01); *H01L 2224/05567* (2013.01); *H01L 2224/05644* (2013.01); *H01L 2924/35121* (2013.01)

(58) Field of Classification Search
CPC ..... H01L 23/291; H01L 23/293; H01L 24/05; H01L 2924/35121; H01L 23/3192; H01L 2224/05567; H01L 2224/05644
USPC ............... 257/288, 741, 792, 763, 773, 781; 438/15, 151, 197, 199, 612, 614
See application file for complete search history.

(56) References Cited

U.S. PATENT DOCUMENTS

| | | | |
|---|---|---|---|
| 8,269,349 B2* | 9/2012 | Hishida | H01L 24/05 257/750 |
| 2006/0291516 A1* | 12/2006 | Aoki | H01S 5/125 372/50.11 |
| 2012/0211761 A1* | 8/2012 | Yamada | H01L 21/28264 257/76 |

(Continued)

FOREIGN PATENT DOCUMENTS

| | | |
|---|---|---|
| JP | H01-093131 A | 4/1989 |
| JP | H05-136298 A | 6/1993 |

(Continued)

OTHER PUBLICATIONS

Notice of Reasons for Rejection in counterpart Japanese Patent Application No. 2013-100364, dated Jan. 17, 2017.

*Primary Examiner* — Jarrett Stark
*Assistant Examiner* — Shahed Ahmed
(74) *Attorney, Agent, or Firm* — Venable LLP; Michael A. Santori

(57) ABSTRACT

A semiconductor device includes a substrate having an edge, a semiconductor layer provided on a substrate, an electrode pad provided on the semiconductor layer, an inorganic insulating film having a first opening through which an upper surface of the electrode pad is exposed, and a resin film provided on the inorganic insulating film, the resin film having a second opening and a third opening separated from each other, where the upper surface of the electrode pad is exposed through the second opening, where the third opening is located between the second opening and the edge of the substrate, and where a bottom of the third opening is constituted by the resin film or the inorganic insulating film.

17 Claims, 10 Drawing Sheets

(56) References Cited

U.S. PATENT DOCUMENTS

2013/0134424 A1* 5/2013 Kim .................... H01L 27/124
257/59

FOREIGN PATENT DOCUMENTS

| JP | 2000-357743 A | 12/2000 |
| JP | 2010-153707 A | 7/2010 |

\* cited by examiner

SEMICONDUCTOR DEVICE

BACKGROUND OF THE INVENTION

Field of the Invention

The present invention relates to a semiconductor device.

Related Background Art

An insulating film is provided in order to protect a semiconductor device from moisture, foreign substances, a shock from the outside, and the like. For example, an inorganic insulating film such as silicon nitride (SiN) film and a resin film such as a polyimide film are laminated. Since the SiN film has low water permeability, the moisture resistance of a semiconductor device increases. In addition, a semiconductor device can be protected from foreign substances and a shock by the polyimide film. Japanese Unexamined Patent Application Publication No. 2010-153707 discloses a semiconductor device in which a metal layer is provided at the interface between an inorganic insulating film and an electrode pad.

SUMMARY OF THE INVENTION

When the volume of a resin film changes due to the absorption of moisture and a change in temperature, stress is applied to a SiN film which is formed below the resin film. The stress causes the peeling-off of the SiN film from an electrode pad. When the SiN film is peeled off from the electrode pad, moisture has a tendency to infiltrate from a place in which peeling-off is generated. When the moisture infiltrates into the electrode pad, an electrode connected to a semiconductor layer, or the like, electrode materials are dissolved in the moisture, and thus the migration of metal ions constituting the electrode is generated. A short circuit is likely to occur between electrode pads due to this migration. Particularly, in a field effect transistor (FET) in which a high voltage is applied, migration has a tendency to be generated. An object of the present invention is to provide a semiconductor device having high moisture resistance.

According to one embodiment of the present invention, there is provided a semiconductor device including: a semiconductor layer provided on a substrate; an electrode pad provided on the semiconductor layer; an inorganic insulating film in contact with the electrode pad, the inorganic insulating film having a first opening through which an upper surface of the electrode pad is exposed; and a resin film provided on the inorganic insulating film the resin film having a second opening and a third opening, where the upper surface of the electrode pad is exposed through the second opening, where the third opening is located between the second opening and the resin film located at an edge of the substrate, and wherein a bottom of the third opening is constituted by the resin film or the inorganic insulating film covering the semiconductor layer.

In the above configuration, an inner edge of the first opening can be configured to be located inside the second opening.

According to another one embodiment of the present invention, there is provided a semiconductor device including: a semiconductor layer provided on a substrate; an electrode pad provided on the semiconductor layer; an inorganic insulating film in contact with the electrode pad, the inorganic insulating film having a first opening through which an upper surface of the electrode pad is exposed; and a resin film provided on the inorganic insulating film, the resin film having a second opening, where both the upper surface and a lateral side of the electrode pad are located at the inside of the second opening.

In the configuration of another one embodiment, the resin film can be configured to have a third opening which is located outside the second opening.

In the above configurations, the third opening can be configured to be formed by an upper surface of the inorganic insulating film being exposed.

In the above configurations, the resin film can be configured to be formed of polyimide or benzocyclobutene.

In the above configurations, the inorganic insulating film can be configured to be formed of silicon nitride or silicon oxynitride.

In the above configurations, the semiconductor layer can be configured to form a FET, and the electrode pad can be configured to be a drain pad or a source pad of the FET.

In the above configurations, the semiconductor device can be configured to further include a plurality of source fingers, a plurality of drain fingers and a plurality of gate fingers which are provided on the FET, and the drain pad can be configured to be connected to the plurality of drain fingers.

In the above configurations, the upper surface of the electrode pad can be configured to be formed of gold.

DESCRIPTION OF THE PREFERRED EMBODIMENTS

Embodiments of the present invention will be described with reference to the accompanying drawings.

Embodiment 1

Figure 1:
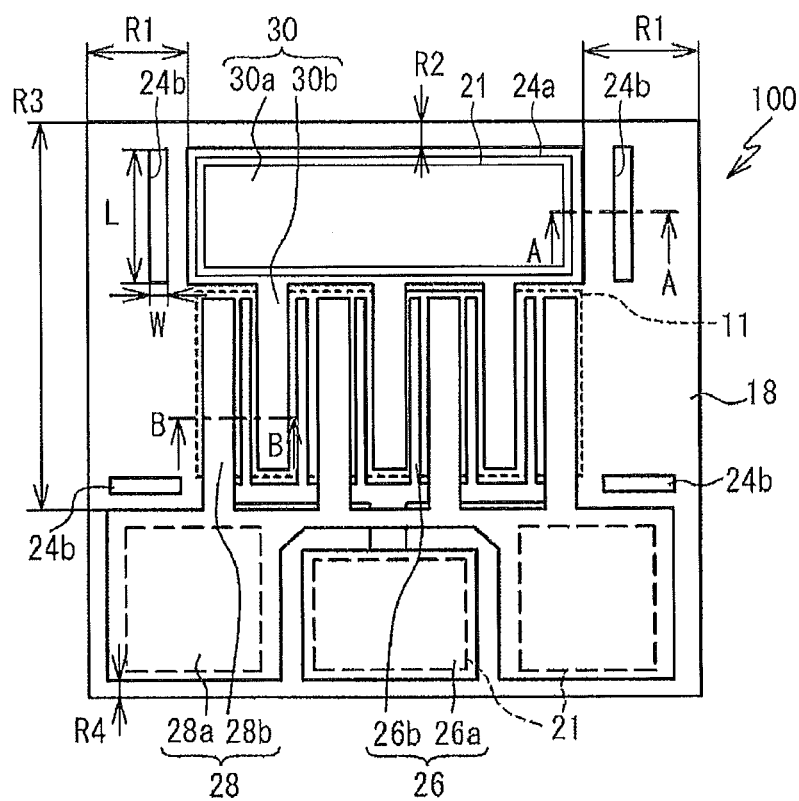
FIG. 1 is a plan view illustrating a semiconductor device according to Embodiment 1.

Embodiment 1 is an example in which a polyimide film 24 is provided with an opening 24b. FIG. 1 is a plan view illustrating a semiconductor device 100 according to Embodiment 1. SiN films 20 and 22 and the polyimide film 24 are shown in perspective. Openings 21 are shown by broken lines. A region shown by a dotted line in FIG. 1 is an active region 11. The semiconductor device 100 is a FET having a finger structure.

Figure 2A:
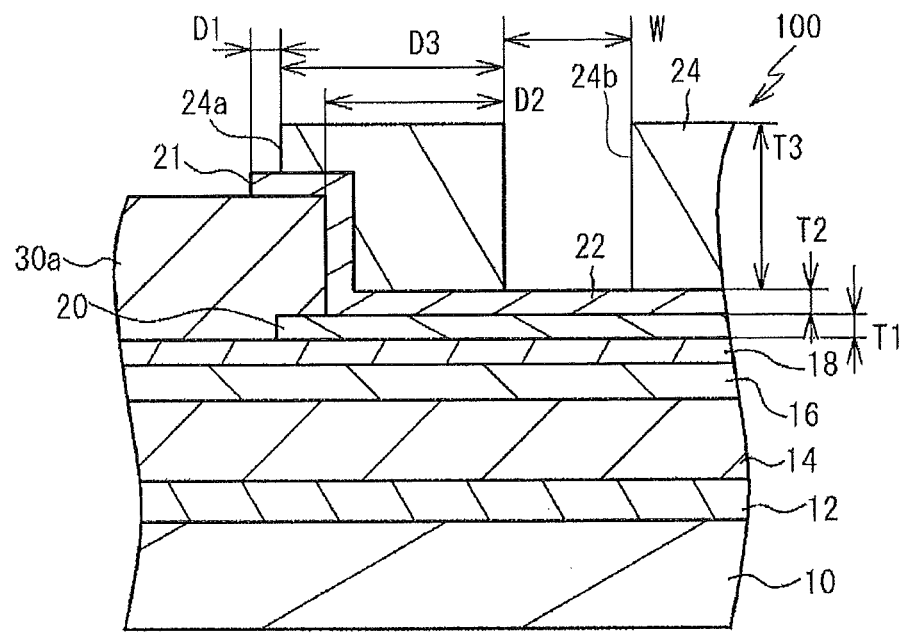
FIG. 2A is a cross-sectional view taken along line A-A of FIG. 1.
Figure 2B:
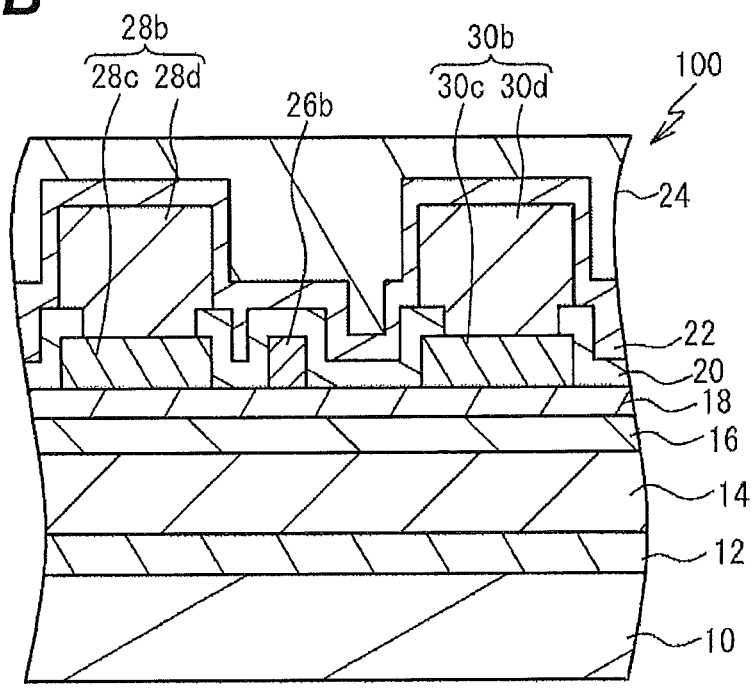
FIG. 2B is a cross-sectional view taken along line B-B of FIG. 1.

FIG. 2A is a cross-sectional view taken along line A-A of FIG. 1. FIG. 2B is a cross-sectional view taken along line B-B of FIG. 1. As shown in FIGS. 2A and 2B, the semiconductor device 100 includes a substrate 10, a buffer layer 12, a channel layer 14, an electron supply layer 16, a cap layer 18, the SiN films 20 and 22, and the polyimide film 24 (resin film) which are laminated in order from the bottom. The polyimide film 24 is provided in order to protect the SiN films 20 and 22 from stress applied when the semiconductor device 100 is mounted.

The substrate 10 is formed of silicon carbide (SiC) or the like. The buffer layer 12, the channel layer 14, the electron supply layer 16, and the cap layer 18 are an epitaxially-grown nitride semiconductor layer. The buffer layer 12 is formed of, for example, aluminum nitride (AlN) having a thickness of 300 nm, and is in contact with the upper surface of the substrate 10. The channel layer 14 is formed of, for example, gallium nitride (GaN) having a thickness of 1,000 nm, and is in contact with the upper surface of the buffer layer 12. The electron supply layer 16 is formed of, for example, aluminum gallium nitride (AlGaN) having a thickness of 20 nm, and is in contact with the upper surface of the channel layer 14. The cap layer 18 is formed of, for example, GaN having a thickness of 5 nm, and is in contact with the upper surface of the electron supply layer 16.

Figure 3:
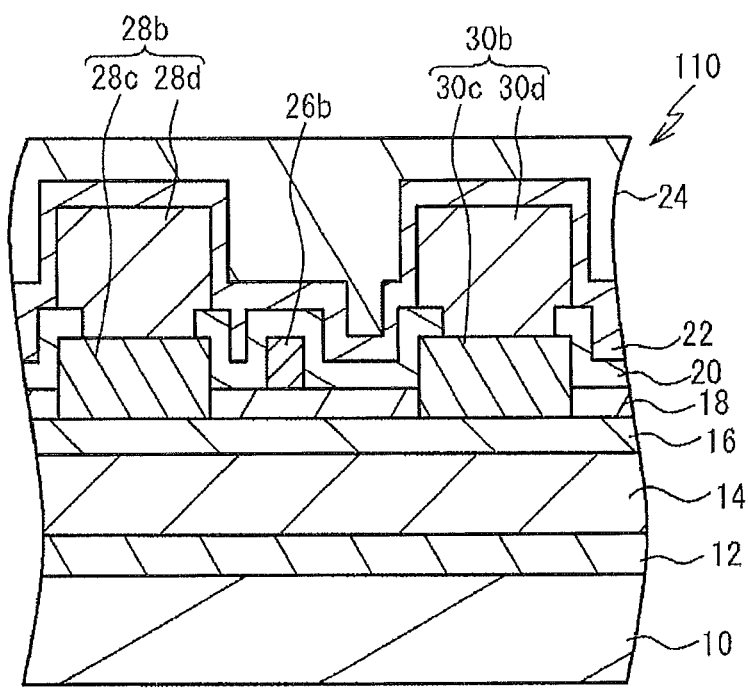
FIG. 3 is a cross-sectional view illustrating a semiconductor device according to a modified example of Embodiment 1.

As shown in FIGS. 1 and 2B, a gate electrode 26, a source electrode 28 and a drain electrode 30 are provided on the upper surface of the cap layer 18. The gate electrode 26 includes a gate pad 26a and gate fingers 26b. The gate pad 26a is connected to a plurality of gate fingers 26b. The gate fingers 26b are in contact with the upper surface of the cap layer 18. The source electrode 28 includes a source pad 28a and source fingers 28b. The source pad 28a is connected to a plurality of source fingers 28b. The drain electrode 30 includes a drain pad 30a and drain fingers 30b. The drain pad 30a is connected to a plurality of drain fingers 30b. The source finger 28b faces the drain finger 30b. The gate finger 26b is provided between the source finger 28b and the drain finger 30b. As shown in FIG. 2B, the source finger 28b includes an ohmic electrode 28c and a wiring layer 28d. The drain finger 30b includes an ohmic electrode 30c and a wiring layer 30d. The ohmic electrodes 28c and 30c are in contact with the upper surface of the cap layer 18. The wiring layer 28d is a member formed integrally with the source pad 28a, and is in contact with the upper surface of the ohmic electrode 28c. The wiring layer 30d is a member formed integrally with the drain pad 30a, and is in contact with the upper surface of the ohmic electrode 30c. FIG. 3 is a cross-sectional view illustrating a semiconductor device 110 according to a modified example of Embodiment 1. As shown in FIG. 3, the source electrode 28 and the drain electrode 30 may be provided on the upper surface of the electron supply layer 16, and the ohmic electrodes 28c and 30c may be in contact with the electron supply layer 16.

As shown in FIGS. 2A and 2B, the SiN film 20 is in contact with the upper surface of the cap layer 18, and covers the outer peripheral portions of the gate finger 26b, and the ohmic electrodes 28c and 30c. The wiring layers 28d and 30d, and the electrode pads (gate pad 26a, source pad 28a and drain pad 30a) are provided on the SiN film 20. The SiN film 22 is in contact with the upper surface of the SiN film 20, and covers the fingers (gate finger 26b, source finger 28b and drain finger 30b). The SiN films 20 and 22 form moisture-resistant films (inorganic insulating films) for protecting the semiconductor device 100 from moisture. The SiN film 22 has the opening 21 (first opening). As shown in FIG. 2A, the opening 21 passes through the SiN film 22. The SiN film 22 covers the outer peripheral portion of the drain pad 30a, and is in contact with the lateral side of the drain pad 30a, and the outer peripheral portion of the upper surface. A region on the central side of the drain pad 30a is exposed from the opening 21. That is, in the drain pad 30a, the portion located further outside than the broken line of FIG. 1 is covered with the SiN film 22, and the portion located further inside than the broken line is exposed. As shown in FIG. 1, similarly to the drain pad 30a, the outer peripheral portions of the gate pad 26a and the source pad 28a are covered with the SiN film 22, and the gate pad 26a and the source pad 28a are exposed from the opening 21.

The polyimide film 24 is in contact with the upper surface of the SiN film 22, and has openings 24a and 24b passing through the polyimide film 24. The opening 24a (second opening) overlaps the opening 21. The electrode pad is exposed from the openings 21 and 24a. Meanwhile, the opening 24a may be formed inside the opening 21, or the inner lateral side of the opening 24a and the inner lateral side of the opening 21 may overlap each other.

As shown in FIG. 1, the opening 24b (third opening) is provided in a region R1 located between the edge of the drain pad 30a and the edge of the substrate 10 (edge of the semiconductor device 100), and a region R3 located between the edge of the source pad 28a and the edge of the substrate 10. As shown in FIG. 2A, the opening 24b passes through the polyimide film 24, and the SiN film 22 is exposed from the opening 24b. Meanwhile, the opening 24b may be provided in regions other than the region R1 and the region R3. For example, the opening can also be provided in a region located between the edge of the drain pad 30a and the edge of the substrate 10 in the longitudinal direction of the drain pad 30a (not shown). A configuration in the vicinity of the source pad 28a can be made the same as in the vicinity of the drain pad 30a shown in FIG. 2A.

A distance D1 between the inner edge of the opening 21 and the inner edge of the opening 24a as shown in FIG. 2A is, for example, 3 μm. Considering stress applied to the SiN film 22 due to a change in the volume of the polyimide film 24, the distance D1 may be approximately 3 μm. A distance D2 between the inner edge of the opening 24b and the edge of the drain pad 30a is, for example, 7 μm. Meanwhile, the distance D2 may be equal to or less than 7 μm. The opening 24b may be formed outside at least the opening 24a. A distance D3 between the inner edge of the opening 24b and the inner edge of the opening 24a is, for example, 10 μm. Similarly, in the openings 21 and 24a located on the gate pad 26a and the source pad 28a, dimensions are the same as described above. A width W of the opening 24b shown in FIGS. 1 and 2A is, for example, 10 μm, and a length L of the opening 24b shown in FIG. 1 is, for example, 120 μm.

The ohmic electrodes 28c and 30c are formed by laminating a titanium (Ti) layer having a thickness of 10 nm and an aluminum (Al) layer having a thickness of 300 nm from, for example, the side close to the cap layer 18. The gate finger 26b is formed by laminating a nickel (Ni) layer having a thickness of 50 nm and an Au layer having a thickness of 300 nm from, for example, the side close to the cap layer 18. The wiring layers 28d and 30d, and the electrode pad are formed of, for example, gold (Au) having a thickness of 2 to 4 μm. A thickness T1 of the SiN film 20 and a thickness T2 of the SiN film 22 as shown in FIG. 2A are, for example, 500 nm. A thickness T3 of the polyimide film 24 is, for example, 5 μm. The polyimide film 24 is found of, for example, photosensitive polyimide.

Figure 4A:
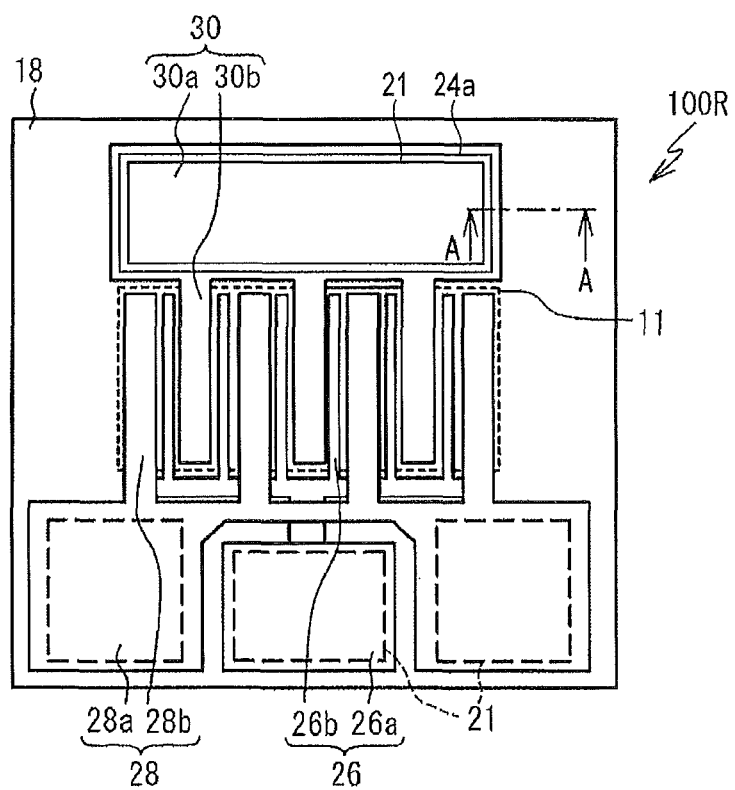
FIG. 4A is a plan view illustrating a semiconductor device according to a comparative example.
Figure 4B:
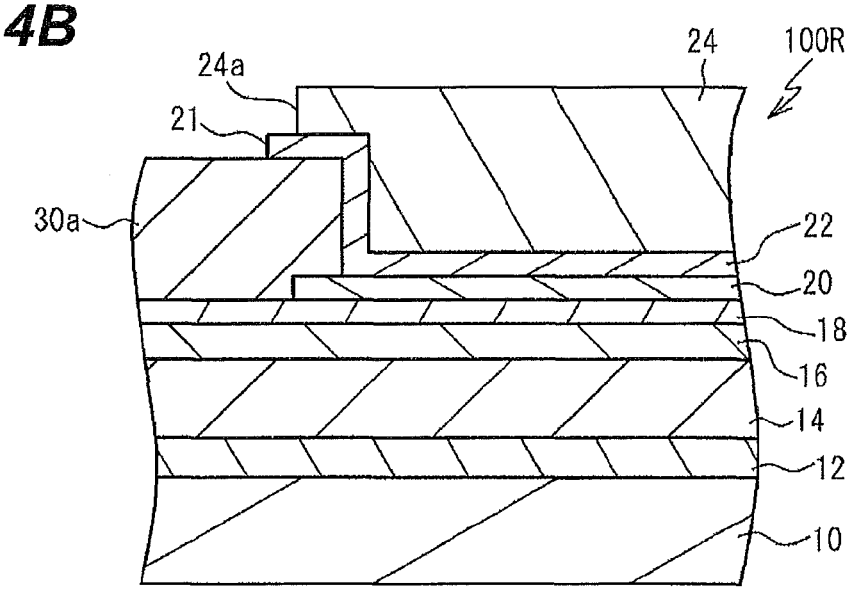
FIG. 4B is a cross-sectional view taken along line A-A of FIG. 4A.

Next, a comparative example will be described. FIG. 4A is a plan view illustrating a semiconductor device 100R according to the comparative example. FIG. 4B is a cross-sectional view taken along line A-A of FIG. 4A. As shown in FIGS. 4A and 4B, the polyimide film 24 does not have the opening 24b. The polyimide film 24 covers the SiN film 22 other than in the opening 24a.

The volume of the polyimide film 24 changes due to the moisture absorption of the polyimide film 24, a change in temperature, and the like. In the comparative example, large stress is likely to be applied to the SiN films 20 and 22 due to a change in volume. The peeling-off of the SiN film 22 is generated in the periphery of the electrode pad due to the stress. The moisture resistance of the semiconductor device 100R is reduced due to the peeling-off. That is, the gate finger 26b, the ohmic electrodes 28c and 30c, and the like are dissolved in moisture infiltrated from a place in which peeling-off is generated. As a result, migration occurs.

According to Embodiment 1, since the opening 24b is provided as shown in FIGS. 1 and 2A, stress in accordance with the deformation of the polyimide film 24 is reduced. The peeling-off of the SiN film 22 is suppressed by the reduction of stress. Therefore, the SiN film 22 functions as a moisture-resistant film for suppressing the infiltration of moisture. Migration is suppressed, and thus the moisture resistance of the semiconductor device 100 increases.

The region R1 shown in FIG. 1 is a region from the drain pad 30a to the left edge of the substrate 10 shown in FIG. 1, and a region from the drain pad 30a to the right edge of the substrate 10. The region R2 is a region from the drain pad 30a to the upper edge of the substrate 10 shown in FIG. 1. The distance from the edge of the drain pad 30a on the region R1 side to the edge of the substrate 10 is larger than the distance on the region R2 side. The drain pad 30a comes into contact with the polyimide film 24 having a large area on the region R1 side. Since the area of the polyimide film 24 is large, around the drain pad 30a, stress increases on the region R1 side. The region R3 is a region from the source pad 28a to the upper edge of the substrate 10 in FIG. 1. The region R3 is wider than a region R4 from the source pad 28a to the lower edge of the substrate 10 shown in FIG. 1. Around the source pad 28a, stress increases on the region R3 side. The regions R1 and R3 are provided with the opening 24b, thereby allowing stress to be effectively relieved.

As shown in FIG. 2A, the inner edge of the opening 21 is located at the central side of the drain pad 30a, as compared to the inner edge of the opening 24a. As compared to a case where the inner edge of the opening 21 and the inner edge of the opening 24a overlap each other in a thickness direction, the area of contact of the SiN film 22 with the polyimide film 24 is reduced in Embodiment 1. Stress is reduced due to a reduction in the area of contact therebetween. As a result, the SiN film 22 is not likely to be peeled off, and moisture resistance increases.

In Embodiment 1 and the comparative example, a moisture resistance test was performed. Eight semiconductor devices were placed under high temperature and high humidity, and a voltage was applied thereto. The numbers of failures generated in eight samples were compared with each other. The conditions of the test are shown in Table 1.

TABLE 1

| | Size [mm²] | Temp [° C.] | Humidity [%] | Time [h] | Vds [V] | Vgs [V] |
|---|---|---|---|---|---|---|
| Embodiment 1 Comparative Example | 0.7 × 2 | 130 | 85 | 96 | 50 | −3 |

Table 1 shows the size, temperature, humidity, time, source-drain voltage Vds, and gate-source voltage Vgs of the semiconductor device, from the left side. As shown in Table 1, the same conditions were used in Embodiment 1 and the comparative example.

Table 2 is a table showing the results of the test.

TABLE 2

| | Number of Failures/ Number of Samples |
|---|---|
| Embodiment 1 | 0/8 |
| Comparative Example | 6/8 |

As shown in Table 2, failure was generated in six of eight samples in the comparative example, whereas failure was not generated in Embodiment 1. As described above, according to Embodiment 1, moisture resistance increases.

Figure 5A:
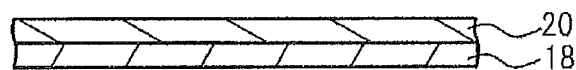
FIGS. 5A to 5D are cross-sectional views illustrating a method of manufacturing a semiconductor device.
Figure 5B:

A manufacturing method will be described below. FIGS. 5A to 6B are cross-sectional views illustrating a method of manufacturing the semiconductor device 100, and show the vicinity of the drain pad 30a. FIG. 6C is a cross-sectional view illustrating another example of a method of manufacturing the semiconductor device 100. FIGS. 7A to 8B are cross-sectional views illustrating a manufacturing method, and show cross-sections taken along line B-B of FIG. 1. The same processes as those in FIGS. 5A to 6B are performed in the vicinities of the gate pad 26a and the source pad 28a. The nitride semiconductor layer (buffer layer 12, channel layer 14, electron supply layer 16 and cap layer 18) are epitaxially grown on the substrate 10 in a state of a wafer using, for example, metal organic chemical vapor deposition (MOCVD). In FIGS. 5A to 8B, the substrate 10, the buffer layer 12, the channel layer 14, and the electron supply layer 16 are not shown, but these layers are provided below the cap layer 18. Regions other than the active region 11 shown in FIG. 1 are inactivated.

Figure 7A:
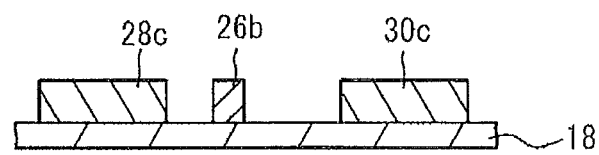
FIGS. 7A to 7C are cross-sectional views illustrating a method of manufacturing a semiconductor device.
Figure 7B:
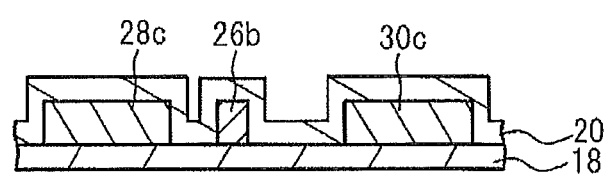
Figure 7C:
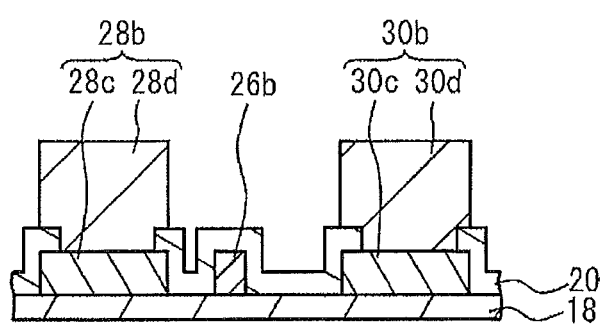

As shown in FIG. 7A, the gate finger 26b, and the ohmic electrodes 28c and 30c are provided using, for example, an evaporation and lift-off method or the like. In the case that the ohmic electrodes 28c and 30c are formed on the upper surface of the electron supply layer 16 as shown in FIG. 3, the cap layer 18 is removed using dry etching or the like before the formation of the ohmic electrodes. As shown in FIGS. 5A and 7B, the SiN film 20 is provided. As shown in FIG. 5B, an opening is formed in the SiN film 20. The drain pad 30a is provided on the exposed cap layer 18. As shown in FIGS. 5B and 7C, an opening is formed in the SiN film 20. The wiring layer 28d is provided on the exposed ohmic electrode 28c, and the wiring layer 30d is provided on the ohmic electrode 30c. The drain pad 30a is provided on the exposed cap layer 18. That is, the electrode pad including the drain pad 30a, and the wiring layer 30d are formed by the same process using, for example, a plating method.

Figure 5C:
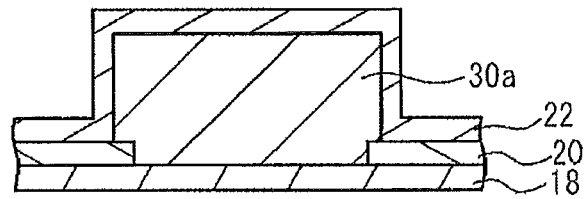
Figure 5D:
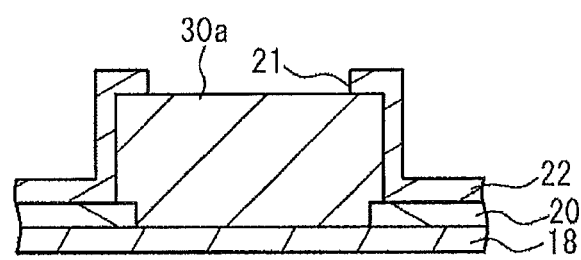
Figure 8A:
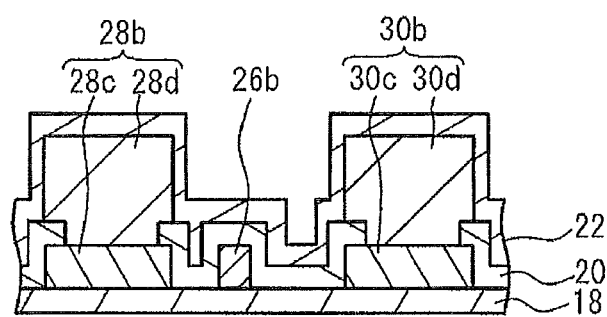
FIGS. 8A and 8B are cross-sectional views illustrating a method of manufacturing a semiconductor device.

As shown in FIGS. 5C and 8A, the SiN film 22 that covers the drain pad 30a, and the wiring layers 28d and 30d are provided. As shown in FIG. 5D, the opening 21 is formed in the SiN film 22 using, for example, dry etching. The upper surfaces of the drain pad 30a, and the gate pad 26a and the source pad 28a which are not shown are exposed from the opening 21.

Figure 6A:
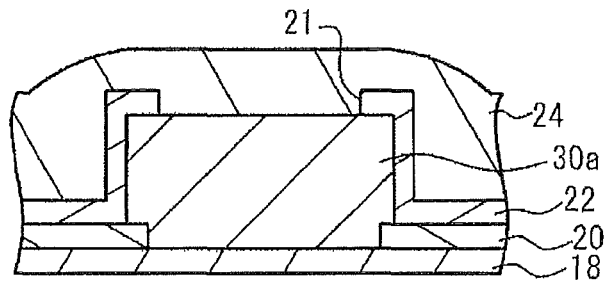
FIGS. 6A and 6B are cross-sectional views illustrating a method of manufacturing a semiconductor device.
Figure 6B:
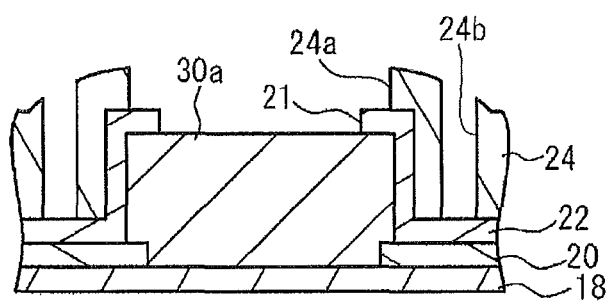
Figure 6C:
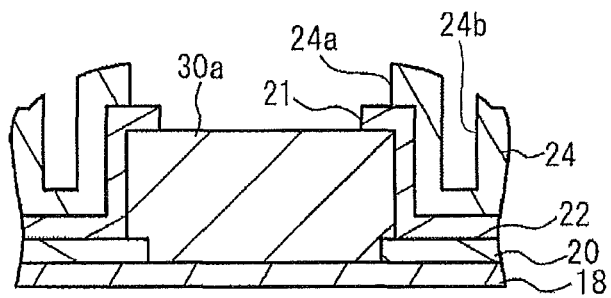
FIG. 6C is a cross-sectional view illustrating another example of a method of manufacturing a semiconductor device.
Figure 8B:
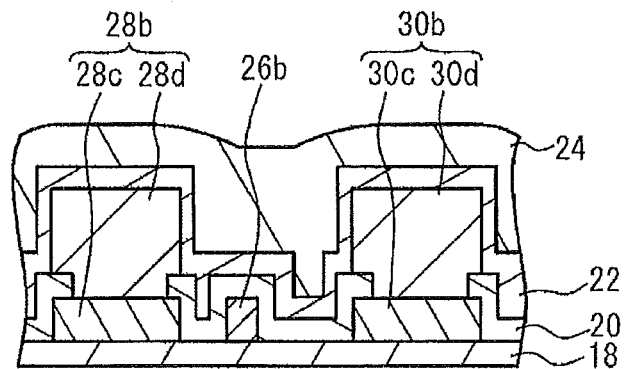

As shown in FIGS. 6A and 8B, the polyimide film 24 is provided by applying, for example, a photosensitive polyimide resin. The polyimide film 24 covers the drain pad 30a shown in FIG. 6A, the gate pad 26a and the source pad 28a which are not shown, and the SiN film 22 shown in FIGS. 6A and 8B. As shown in FIG. 6B, the openings 24a and 24b are formed in the polyimide film 24 by, for example, an exposure and etching process. Further, the polyimide film 24 is cured by heat treatment. Meanwhile, as shown in FIG. 6C, the opening 24b may not pass through the polyimide film 24.

Figure 9A:
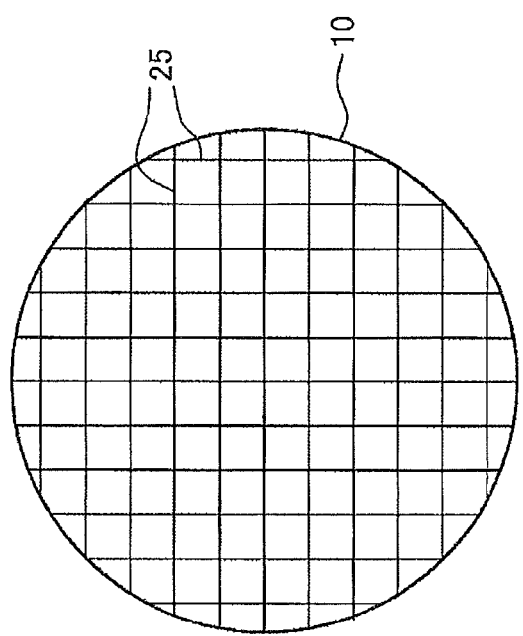
FIG. 9A is a plan view illustrating a substrate in a state of a wafer.
Figure 9B:
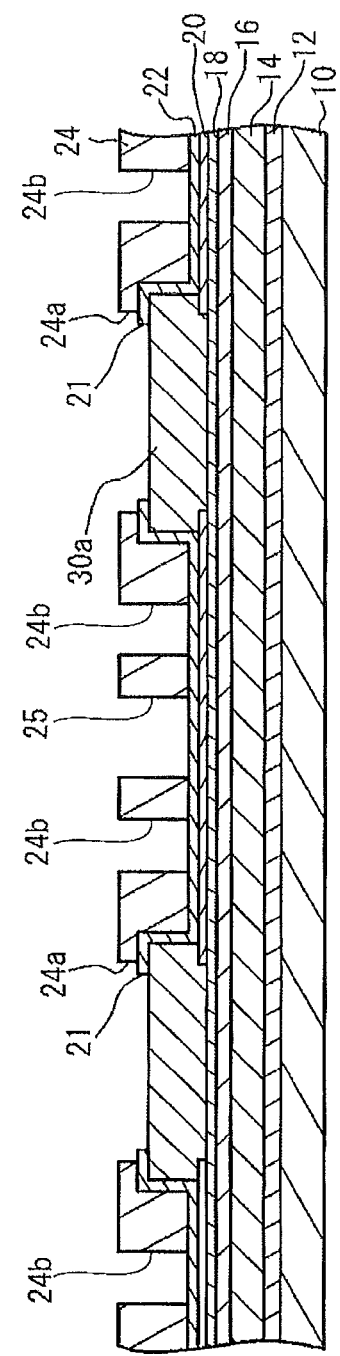
FIG. 9B is a cross-sectional view illustrating the substrate in a state of a wafer.

FIG. 9A is a plan view illustrating the substrate 10 in a state of a wafer. As shown in FIG. 9A, a plurality of scribe lines 25 are fouled on the substrate 10 in a state of a wafer. FIG. 9B is a cross-sectional view illustrating the substrate 10 in a state of a wafer. As shown in FIG. 9B, in a process of forming the openings 24a and 24b, the polyimide film 24 below the scribe line 25 is also removed by an exposure and etching process, and the SiN film 22 below the scribe line 25 is exposed. The semiconductor device 100 is formed by dividing the substrate 10 in a state of a wafer into individual pieces through a dicing process.

The SiN films 20 and 22 may have a sufficient thickness to suppress the infiltration of moisture. The thicknesses T1 and T2 may be set to be equal to or greater than 200 nm and equal to or less than 1,200 nm. The polyimide film 24 protects the semiconductor device 100 from a shock or the like from the outside. For the purpose of protection, the polyimide film 24 may be thick. As the polyimide film 24 becomes thicker, stress applied to the SiN films 20 and 22 increase. For the purpose of protection and stress relief, the thickness T3 may be, for example, equal to or greater than 2 μm and equal to or less than 6 μm, or the like. The opening 24b may not pass through the polyimide film 24. That is, the opening 24b can be formed as a concave region provided in the polyimide film 24. In addition, the opening 24b may pass through the polyimide film 24, and may be formed in the SiN films 20 and 22. In order to increase moisture resistance, the opening 24b may not pass through the SiN film 20, and that the entire bottom of the opening 24b be constituted by the SiN film 22 or the polyimide film 24. The number of openings 24b, and the width W and length L thereof can be changed depending on the size of the semiconductor device 100, the thickness T3 of the polyimide film 24, or the like. In FIG. 1, one of the openings 24b is provided in each of two regions R1. For example, two or more openings 24b may be provided in one region R1. The opening 24b may be provided in one of two regions R1, and the opening 24b may not be provided in the other region. The opening 24b may be provided in the regions R2 and R4. In this manner, it is effective to provide the opening 24b between the opening 24a and the polyimide film 24 located at the edge of the substrate 10.

The upper surfaces of the electrodes (gate electrode 26, source electrode 28 and drain electrode 30) are formed of Au. Au has low adhesion to SiN. On the other hand, polyimide has high adhesion to SiN. The SiN films 20 and 22 are not likely to be peeled off by providing the SiN films 20 and 22 on the electrodes and providing the polyimide film 24 and the opening 24b on the SiN film 22, and thus moisture resistance increases. The electrode pad, and the wiring layers 28d and 30d may be formed of metals other than Au. An inorganic insulating film such as, for example, a silicon oxynitride film (SiON film) may be provided in addition to the SiN films 20 and 22. A film made of a resin such as, for example, benzocyclobutene may be provided in addition to the polyimide film 24. The inorganic insulating film has low water permeability, but has low adhesion to the electrode pad. The resin film has high adhesion to the inorganic insulating film, but has the volume thereof changed by absorption of water and a change in temperature. According to Embodiment 1, it is possible to suppress peeling-off, and to obtain high moisture resistance and protection through a lamination structure of the inorganic insulating film and the resin film.

Embodiment 2

Figure 10A:
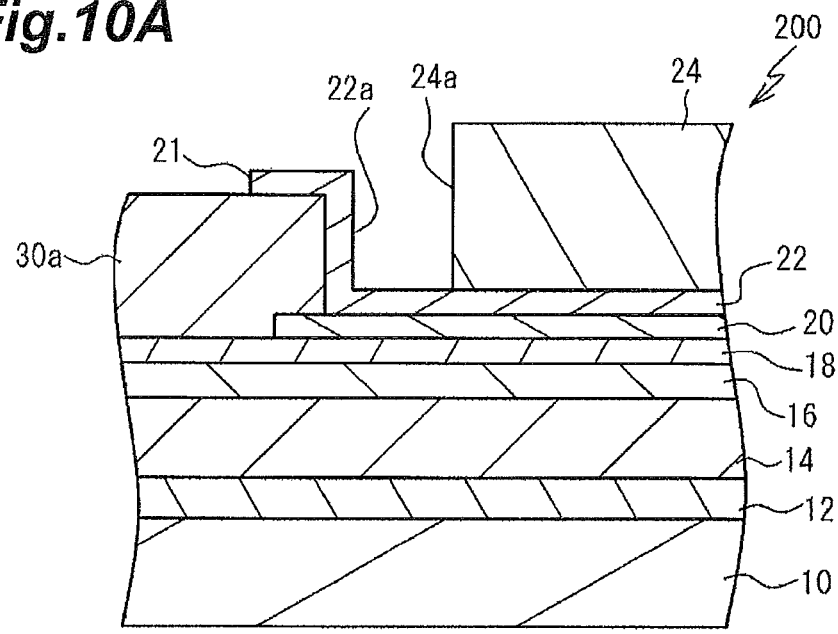
FIG. 10A is a cross-sectional view illustrating a semiconductor device according to Embodiment 2.

FIG. 10A is a cross-sectional view illustrating a semiconductor device 200 according to Embodiment 2. The same configurations as those of the semiconductor device 100 will not be described.

As shown in FIG. 10A, the inner edge of the opening 24a is separated from a portion 22a which is in contact with the edge of the drain pad 30a and the edge of the drain pad 30a of the SiN film 22, in a direction (horizontal direction in the drawing) in which the upper surface of the drain pad 30a extends. Both the upper surface and the lateral side of the drain pad 30a are located inside the opening 24a. Thereby, even when the volume of the polyimide film 24 changes, stress applied to the SiN film 22 is relieved, and thus it is possible to suppress the peeling-off of the SiN film 22 from the drain pad 30a. The opening 24b provided in Embodiment 1 is not provided in Embodiment 2. Meanwhile, in the peripheries of the gate pad 26a and the source pad 28a, the polyimide film 24 also has the same configurations as those in FIG. 10A.

According to Embodiment 2, the area of contact of the SiN film 22 with the polyimide film 24 is reduced in the periphery of the drain pad 30a. Since stress is reduced, the SiN film 22 is not likely to be peeled off. As a result, the moisture resistance of the semiconductor device 200 increases.

Figure 10B:
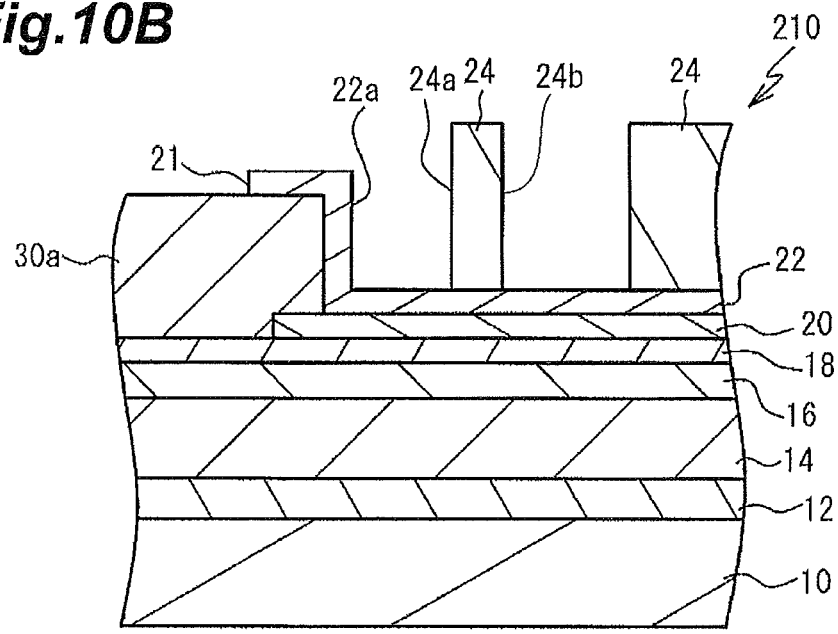
FIG. 10B is a cross-sectional view illustrating a semiconductor device according to a modified example of Embodiment 2.

FIG. 10B is a cross-sectional view illustrating a semiconductor device 210 according to a modified example of Embodiment 2. As shown in FIG. 10B, the polyimide film 24 is provided with the openings 24a and 24b. The inner edge of the opening 24a is separated from the edge of the drain pad 30a. According to the modified example, it is possible to increase moisture resistance more effectively.

Embodiments 1 and 2 are examples of a FET using a nitride semiconductor. In the FET using a nitride semiconductor, a high voltage is applied. Particularly, since a high voltage is applied to the drain pad 30a, migration has a tendency to be generated in the drain pad 30a. According to Embodiments 1 and 2, migration can be effectively suppressed. The nitride semiconductor refers to a semiconductor containing nitrogen, and includes, for example, InN (indium nitride), InGaN (indium gallium nitride), InAlN (indium nitride aluminum), AlInGaN (aluminum indium gallium nitride), and the like. The FET may be formed of an arsenic-based semiconductor such as, for example, gallium arsenide (GaAs). Embodiments 1 and 2 may be applied to transistors or the like other than the FET.

As described above, although the embodiments of the invention have been described in detail, the present invention is not limited to such specific embodiments, but various modifications and changes can be made without departing from the scope of the invention described in the appended claims.

What is claimed is:

1. A semiconductor device comprising:
   a substrate having an edge;
   a semiconductor layer provided on the substrate;
   an electrode pad provided on the semiconductor layer;
   an inorganic insulating film formed on and in contact with the electrode pad, the inorganic insulating film having a first opening through which an upper surface of the electrode pad is exposed; and
   a resin film provided on the inorganic insulating film, the resin film having a second opening and a third opening separated from each other,
   wherein the upper surface of the electrode pad is exposed through the second opening,
   wherein the third opening is located between the second opening and the edge of the substrate,
   wherein a whole bottom of the third opening is exposed and consists of the resin film or the inorganic insulating film, and
   wherein the resin film is formed of polyimide or benzocyclobutene.

2. The semiconductor device according to claim 1, wherein an edge of the first opening is located inside of the second opening.

3. The semiconductor device according to claim 1, wherein the inorganic insulating film is formed of silicon nitride or silicon oxynitride.

4. The semiconductor device according to claim 1, wherein the semiconductor layer forms a FET, and
   wherein the electrode pad is a drain pad or a source pad of the FET.

5. The semiconductor device according to claim 1, wherein the upper surface of the electrode pad is formed of gold.

6. A semiconductor device comprising:
   a semiconductor layer provided on a substrate;
   an electrode pad provided on the semiconductor layer;
   an inorganic insulating film in contact with the electrode pad, the inorganic insulating film having a first opening through which an upper surface of the electrode pad is exposed; and
   a resin film provided on the inorganic insulating film, the resin film having a second opening and a third opening,
   wherein both the upper surface and a lateral side of the electrode pad are located at the inside of the second opening,
   wherein a whole bottom of the third opening is exposed and consists of the resin film or the inorganic insulating film, and
   wherein the resin film is formed of polyimide or benzocyclobutene.

7. The semiconductor device according to claim 6, wherein the third opening is formed by an upper surface of the inorganic insulating film being exposed.

8. The semiconductor device according to claim 6, wherein the inorganic insulating film is formed of silicon nitride or silicon oxynitride.

9. The semiconductor device according to claim 6, wherein the semiconductor layer forms a FET, and
   the electrode pad is a drain pad or a source pad of the FET.

10. The semiconductor device according to claim 6, wherein the upper surface of the electrode pad is formed of gold.

11. A semiconductor device comprising:
    a substrate having an edge;
    a semiconductor layer provided on the substrate;
    an electrode pad provided on the semiconductor layer; and
    a resin film provided on the electrode pad, the resin film having a first opening and a second opening separated from each other,
    wherein an upper surface of the electrode pad is exposed through the first opening,
    wherein the second opening is located between the first opening and the edge of the substrate,
    wherein a whole bottom of the second opening is exposed and consists of the resin film or an inorganic insulating film, and
    wherein the resin film is formed of polyimide or benzocyclobutene.

12. The semiconductor device according to claim 11, further comprising an inorganic insulating film located between the semiconductor layer and the resin film.

13. The semiconductor device according to claim 11, wherein the inorganic insulating film is formed of silicon nitride or silicon oxynitride.

14. The semiconductor device according to claim 1, wherein a depth of the third opening is greater than a depth of the second opening.

15. The semiconductor device according to claim 6, wherein a depth of the third opening is greater than a depth of the second opening.

16. The semiconductor device according to claim 11, wherein a depth of the second opening is greater than a depth of the first opening.

17. The semiconductor device according to claim 2, wherein an edge of the second opening horizontally extends outward from the edge of the first opening.

* * * * *